(12) United States Patent
Nagashima et al.

(10) Patent No.: US 9,729,242 B2
(45) Date of Patent: Aug. 8, 2017

(54) OPTICAL MODULE FOR REDUCING CROSSTALK

(71) Applicant: FURUKAWA ELECTRIC CO., LTD., Tokyo (JP)

(72) Inventors: Kazuya Nagashima, Tokyo (JP); Yozo Ishikawa, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 110 days.

(21) Appl. No.: 14/603,567

(22) Filed: Jan. 23, 2015

(65) Prior Publication Data

US 2016/0218810 A1    Jul. 28, 2016

(51) Int. Cl.
*H04B 10/40* (2013.01)
*H01L 25/16* (2006.01)
*H05K 1/02* (2006.01)
*H01S 5/022* (2006.01)

(52) U.S. Cl.
CPC ............ *H04B 10/40* (2013.01); *H01L 25/167* (2013.01); *H05K 1/0228* (2013.01); *H05K 1/0243* (2013.01); *H01L 2224/05554* (2013.01); *H01L 2224/48137* (2013.01); *H01L 2224/4917* (2013.01); *H01L 2924/0002* (2013.01); *H01S 5/02276* (2013.01); *H05K 2201/10121* (2013.01)

(58) Field of Classification Search
CPC ....... H01L 2224/7326; H01L 2225/065; H01L 51/5206; H01L 51/5221; H01L 2224/4917; H01L 25/167; H01P 5/12; H01P 1/15; G02F 1/134; H04B 10/40

USPC .......... 250/214 R, 214.1, 551; 348/292–311
See application file for complete search history.

(56) References Cited

U.S. PATENT DOCUMENTS 7,145,533 B2 * 12/2006 Imamura ................ G09G 3/006
                                                                345/81
8,817,152 B2 *  8/2014 Abe ................... H01L 27/14603
                                                                257/294

FOREIGN PATENT DOCUMENTS

| JP | 5-251820    |    | 9/1993  |
| JP | 2002-261372 |    | 9/2002  |
| JP | 2007-525842 | A  | 9/2007  |
| JP | 2010-239611 | A  | 10/2010 |

* cited by examiner

*Primary Examiner* — Que T Le
(74) *Attorney, Agent, or Firm* — Oblon, McClelland, Maier & Neustadt, L.L.P.

(57) ABSTRACT

The present invention provides an optical module capable of achieving downsizing and high densification, and reducing crosstalk as compared to a conventional optical module. An optical module includes: an optical device including multiple light receiving elements; a control device which transmits and receives signals to and from the optical device; and a substrate including multiple lines which allow passage of the signals. Anode terminals of the multiple light receiving elements are connected to different lines by first wires, respectively. Cathode terminals of the multiple light receiving elements are connected to different lines by second wires, respectively. Each first wire and the corresponding second wire cross each other and are disposed out of contact with each other. The wires connecting each light receiving element and the control device, namely, the wires of each channel cross each other.

9 Claims, 7 Drawing Sheets

OPTICAL MODULE FOR REDUCING CROSSTALK

BACKGROUND OF THE INVENTION

Field of the Invention

The present invention relates to an optical module having a structure in which an optical device including multiple optical elements is connected to a control device by use of wiring.

Description of the Related Art

There have been growing demands for increases in speed and capacity of optical communication in recent years. To meet the demands, there has been used parallel optical transmission configured to transmit optical signals in parallel by using multiple optical fibers or optical waveguides.

In an optical module used for the parallel optical transmission, an integrated, downsized, and high-density circuit is subject to an increase in mutual inductance between neighboring wires, which leads to crosstalk between signals traveling through the wires. The crosstalk further increases when high-frequency signals are used therein. For this reason, the occurrence of crosstalk is a major problem in an optical element which uses high-frequency signals. Accordingly, there has been a request for reducing crosstalk in order to pursue downsizing and higher densification of such an optical element.

As a method of reducing crosstalk between signals, according to the technique described in Japanese Patent Application Publication No. Hei 5-251820, wiring for connecting a laser array to a printed board involves alternate arrangement of lines connected to p-type electrodes of lasers and lines connected to n-type electrodes of the lasers, in which the lines connected to the n-type electrodes are used as the ground. As a result, the wiring has a structure in which each signal line is sandwiched by ground lines, and crosstalk between the signal lines can thereby be reduced.

Meanwhile, according to the technique described in Japanese Patent Application Publication No. 2002-261372, wiring for connecting an optical device and a driving device involves alternate arrangement of lines connected to anode electrodes of the optical device and lines connected to cathode electrodes of the optical device, in which the lines connected to the cathode electrodes are connected to a reference potential line. As a result, the wiring has a structure in which each signal line is sandwiched by ground lines, and crosstalk between the signal lines can thereby be reduced.

FIG. 7 is a schematic diagram of an optical module used in the parallel optical transmission, and having a configuration in which signal lines and ground lines are alternately disposed as in the case of the techniques described in Japanese Patent Application Publications No. Hei 5-251820 and No. 2002-261372. The optical module includes: an optical device 2 having multiple optical elements 1; a control device 3 configured to control the optical device 2; and a substrate 4 having multiple lines 4a and 4b on its surface. The control device 3 is disposed on the substrate 4 in such a way as to be in contact with the multiple lines 4a and 4b. Each of the lines 4a and 4b is connected to one end of a wire 5 and the other end of the wire 5 is connected to a corresponding one of an anode terminal 6a and a cathode terminal 6b annexed to each of the multiple optical elements 1. The wires connecting the lines 4a to the anode terminals 6a and the wires connecting the lines 4b to the cathode terminals 6b are alternately disposed along the surface of the substrate 4. According to this configuration, the multiple optical elements 1 and the control device 3 transmit and receive signals therebetween through the lines 4a and 4b, the wires 5, and the terminals 6a and 6b.

In this optical module, each line 4b connected to the corresponding cathode electrode 6b is connected to the ground on the control device 3 side. Accordingly, the optical module has a structure in which each signal line is sandwiched by ground lines.

The configuration in which the signal lines and the ground lines are alternately disposed, as in the case of the techniques described in Japanese Patent Application Publications No. Hei 5-251820 and No. 2002-261372, may exhibit an insufficient crosstalk reduction effect along with further advances in the downsizing and the high densification. For this reason, there is a demand for another technique that can further reduce the crosstalk.

SUMMARY OF THE INVENTION

An object of the present invention is to provide an optical module, which is capable of achieving downsizing and high densification, and reducing crosstalk as compared to a conventional optical module.

A first aspect of the present invention is an optical module including: an optical element including an anode terminal and a cathode terminal; a control device configured to transmit and receive signals to and from the optical element; a first signal path electrically connecting the anode terminal to the control device, at least part of the first signal path being formed from a first conductive line; and a second signal path electrically connecting the cathode terminal to the control device, at least part of the second signal path being formed from a second conductive line. The first conductive line and the second conductive line cross each other and are out of contact with each other.

A second aspect of the present invention is an optical including: an optical element; a control device including terminals electrically connected to the optical element, an input terminal configured to receive an input signal, and an output terminal configured to transmit an output signal; a first signal path through which the input signal travels to the input terminal, at least part of the first signal path being formed from a first conductive line; and a second signal path through which the output signal travels from the output terminal, at least part of the second signal path being formed from a second conductive line. The first conductive line and the second conductive line cross each other without being in contact with each other.

The optical module according to the present invention can achieve downsizing and high densification, and reduce crosstalk as compared to a conventional optical module.

DETAILED DESCRIPTION OF THE INVENTION

Figure 1:
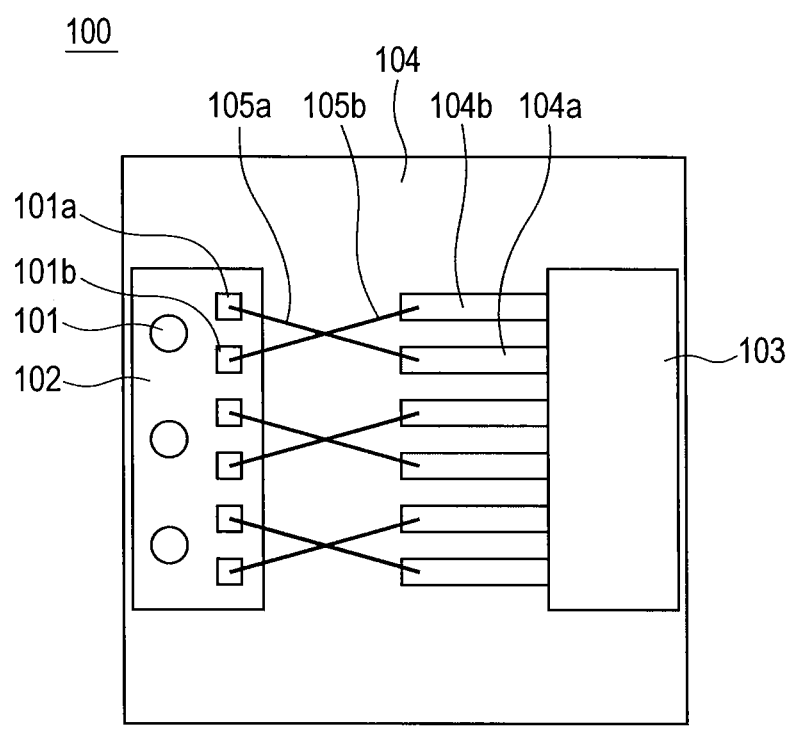
FIG. 1 is a schematic diagram of an optical module according to a first embodiment.

Embodiments of the present invention will be described below with reference to the drawings. It is to be noted, however, that the present invention is not limited only to the following embodiments. Meanwhile, in the drawings to be described below, constituents having similar functions will be denoted by the same reference numerals and duplicate description will be omitted when appropriate.

First Embodiment

FIG. 1 is a schematic diagram of an optical module 100 of this embodiment. The optical module 100 includes: an optical device 102 having multiple light receiving elements 101; a control device 103 configured to transmit and receive signals to and from the optical device 102; and a substrate 104 having multiple lines 104a and 104b which allow passage of the signals.

The optical device 102 includes the multiple light receiving elements 101. Each light receiving element 101 is a photodiode which generates an electric signal upon receipt of light. An arbitrary light receiving element compatible with a high-frequency signal of 1 GHz or higher, or 10 GHz or higher, for example, can be used as the light receiving element 101. Each light receiving element 101 includes an anode terminal 101a and a cathode terminal 101b, which are located on a surface of the optical device 102. In this specification, paths for signals related to each light receiving element 101 are called a channel. Although a total of three channels are illustrated in FIG. 1, the number of channels is not limited to the foregoing.

In this embodiment, the optical device 102 is mounted on the substrate 104. Instead, the optical device 102 may be integrated with the substrate 104. The optical device 102 may adopt any arbitrary configuration as long as the configuration includes the multiple optical elements disposed in parallel so as to be able to realize the parallel optical transmission.

The substrate 104 is a printed board, which includes the multiple conductive lines 104a and 104b on its surface. Each line 104a to be connected to a corresponding anode terminal 101a will be referred to as an anode line 104a and each line 104b to be connected to a corresponding cathode terminal 101b will be referred to as a cathode line 104b. The anode lines 104a and the cathode lines 104b are alternately disposed in parallel with one another. Here, at least as many anode lines 104a as the anode terminals 101a are provided and at least as many cathode lines 104b as the cathode terminals 101b are provided. A pitch (an interval) between one of the anode lines 104a and the adjacent cathode line 104b is set equal to a pitch between one of the anode terminals 101a and the adjacent cathode terminal 101b.

The control device 103 is an integrated circuit (IC) configured to perform processing by receiving electric signals from the light receiving elements 101. The control device 103 includes at least as many terminals (not shown) as a sum of the anode terminals 101a and the cathode terminals 101b. The control device 103 is mounted on the substrate 104 in such a way that the terminals of the control device 103 are in contact with the lines 104a and 104b, respectively. Instead, the control device 103 may be integrated with the substrate 104.

The control device 103 may adopt any arbitrary configuration as long as the control device 103 is connected to the anode terminals and the cathode terminals of the optical elements by way of wiring and configured to perform transmission and reception of the signals.

The anode terminals 101a of the multiple light receiving elements 101 are connected to different anode lines 104a by using first wires 105a, respectively. The anode terminals 101a, the first wires 105a, and the anode lines 104a thus connected collectively function as signal paths to transmit signals to the anode terminals 101a, respectively. In the meantime, the cathode terminals 101b of the multiple light receiving elements 101 are connected to different cathode lines 104b by using second wires 105b, respectively. The cathode terminals 101b, the second wires 105b, and the cathode lines 104b thus connected collectively function as signal paths to transmit signals from the cathode terminals 101b, respectively.

An anode terminal 101a and a cathode terminal 101b provided to one light receiving element 101, i.e., related to the same channel, are respectively connected to two lines 104a and 104b that are adjacent to each other.

Figure 2A:
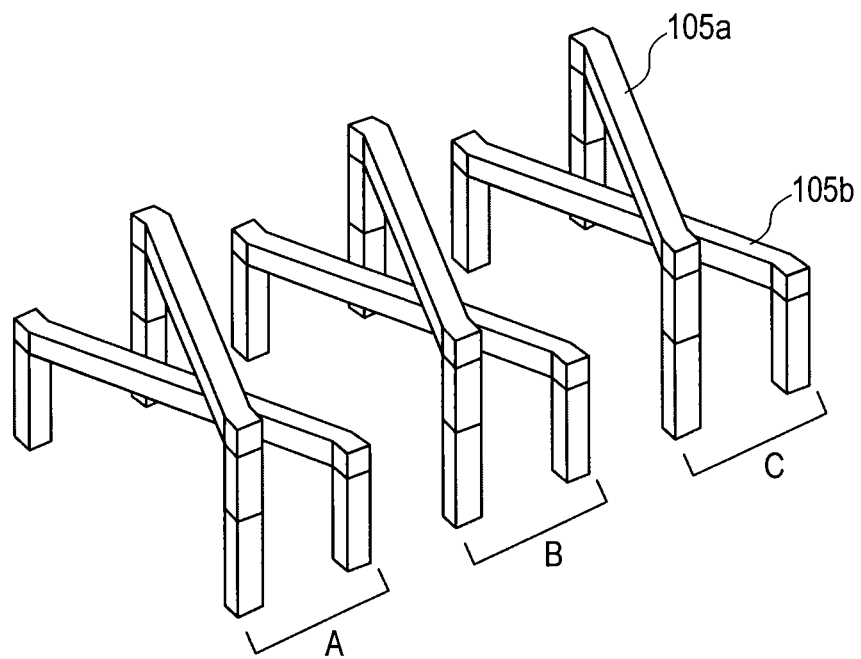
FIG. 2A is a perspective view of wires according to the first embodiment.

In the state where the terminals are connected to the lines, each first wire 105a and the adjacent second wire 105b cross each other and are disposed out of contact with each other. FIG. 2A is a perspective view showing a three-dimensional layout of the first wires 105a and the second wires 105b of this embodiment. The first wire 105a connecting the anode terminal 101a to the anode line 104a is disposed in a crossing manner above and away from the second wire 105b connecting the cathode terminal 101b to the cathode line 104b. This configuration establishes a crossing state of the wires connecting the respective light receiving elements 101 to the control device 103, i.e., the wiring for the channels. In this specification, the above-described structure in which the wires for the same channel are connected in a crossing manner while avoiding the contact therebetween will be referred to as cross wiring.

In this embodiment, the first wire 105a passes over the second wire 105b. Instead, the first wire 105a may pass under the second wire 105b as long as the first wire 105a and the second wire 105b cross each other without coming into contact with each other.

The wires in each of the same channels come close to each other by applying the cross wiring to the wiring between the light receiving elements 101 and the control device 103. Accordingly, electromagnetic field coupling in each of the same channels is enhanced. In the meantime, coupling between different channels adjacent to each other is suppressed. As a result, crosstalk between the different channels is thought to be significantly reduced.

In order to enhance the electromagnetic coupling in the same channel, it is desirable that the first wire 105a and the second wire 105b be located close to each other. To be more precise, a difference in height between the first wire 105a and the second wire 105b is preferably not more than 1.5 times the pitch (the interval between the anode terminal and the cathode terminal, and the interval between the lines) while keeping the first wire 105a and the second wire 105b away from each other at the crossing portion of the first wire 105a and the second wire 105b. It is more preferable that the difference in height between the first wire 105a and the second wire 105b be about equal to or below the pitch.

This embodiment employs the configuration in which all the pitches between the anode terminals 101a and the corresponding cathode terminals 101b are equal, and all the pitches between the anode lines 101a and the corresponding cathode lines 101b are equal. However, the pitches may vary in another applicable configuration. In this case, the pitch (hereinafter referred to as an intra-channel pitch) between the anode terminal 101a and the cathode terminal 101b in the same channel is preferably set equal to or below the pitch (hereinafter referred to as an inter-channel pitch) between the anode terminal 101a (or the cathode terminal 101b) of the aforementioned channel and the cathode terminal 101b (or the anode terminal 101a) of a channel adjacent to the aforementioned channel.

In the configuration where the pitches vary, the difference in height between the first wire 105a and the second wire 105b is preferably not more than 1.5 times the inter-channel pitch while keeping the first wire 105a and the second wire 105b away from each other at the crossing portion of the first wire 105a and the second wire 105b. It is more preferable that the difference in height between the first wire 105a and the second wire 105b be about equal to or below the inter-channel pitch.

EXAMPLES

Crosstalk reduction effects according to the present invention were checked by means of simulation. In the simulation, AWR Microwave Office was used.

Example 1 employed the configuration of the first embodiment. Conditions of the simulation were set as described below. In Example 1, the difference in height between the first wire 105a and the second wire 105b was set smaller than the pitch.

Flat Surface Length: 0.3716 mm
Height (First Wire): 0.175 mm
Height (Second Wire): 0.1 mm
Pitch: 0.125 mm Example 2 had a configuration in which only the height of the first wire was different from that in Example 1. Conditions of the simulation were set as described below. In Example 2, the difference in height between the first wire 105a and the second wire 105b was set equal to the pitch.

Flat Surface Length: 0.3716 mm
Height (First Wire): 0.225 mm
Height (Second Wire): 0.1 mm
Pitch: 0.125 mm Example 3 had a configuration in which only the height of the first wire was different from that in Example 1. Conditions of the simulation were set as described below. In Example 3, the difference in height between the first wire 105a and the second wire 105b was set about 1.5 times the pitch.

Figure 2B:
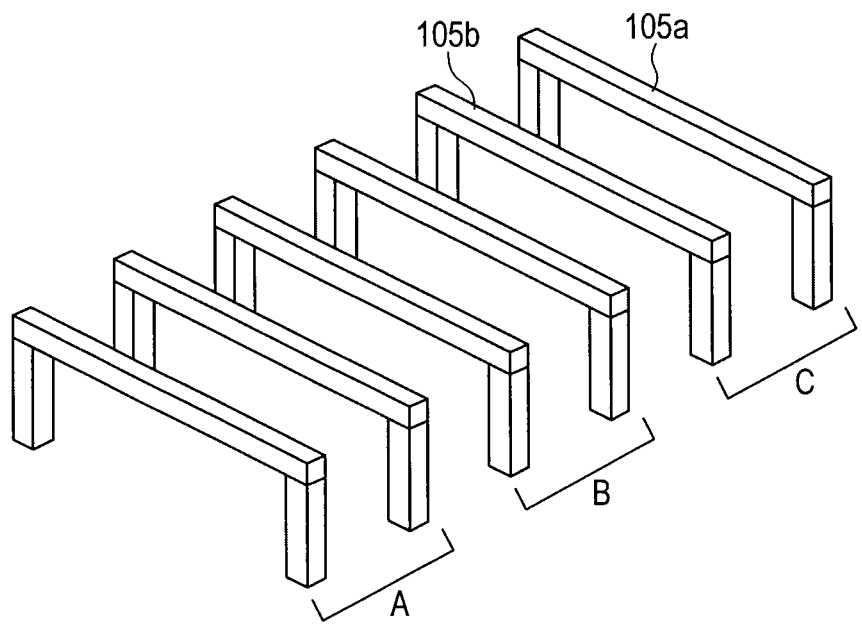
FIG. 2B is a perspective view of wires according to a comparative example.

Flat Surface Length: 0.3716 mm
Height (First Wire): 0.275 mm
Height (Second Wire): 0.1 mm
Pitch: 0.125 mm Comparative Example had a configuration in which each first wire 105a and the corresponding second wire 105b did not cross each other (hereinafter referred to as straight wiring). FIG. 2B is a perspective view showing a three-dimensional layout of the first wires 105a and the second wires 105b in Comparative Example. Features other than the mode of connecting the wires were similar to those of Examples. Conditions of the simulation were set as described below.

Flat Surface Length: 0.35 mm
Height (First Wire): 0.1 mm
Height (Second Wire): 0.1 mm
Pitch: 0.125 mm The flat surface length is the length of each wire in a direction parallel to the substrate, and the height is the length of each wire in a direction perpendicular to the substrate. The pitch is the interval between the anode terminal and the cathode terminal, and is also the interval between the lines equal to the above. Here, distances between the line 104a or 104b and the corresponding terminal 101a or 101b were set equal in all Examples and Comparative Example. However, the flat surface length in each of Examples was longer than that in Comparative Example since Examples adopted the cross wiring.

In general, a channel that brings about crosstalk is called an aggressor channel while a channel that suffers the crosstalk is called a monitor channel. The simulation was conducted by creating a model in which one monitor channel (B in FIGS. 2A and 2B) to which no voltage was applied was sandwiched between two aggressor channels (A and C in FIGS. 2A and 2B) to which voltages were applied. Then, voltages on the respective channels were measured by means of the simulation.

Figure 3A:
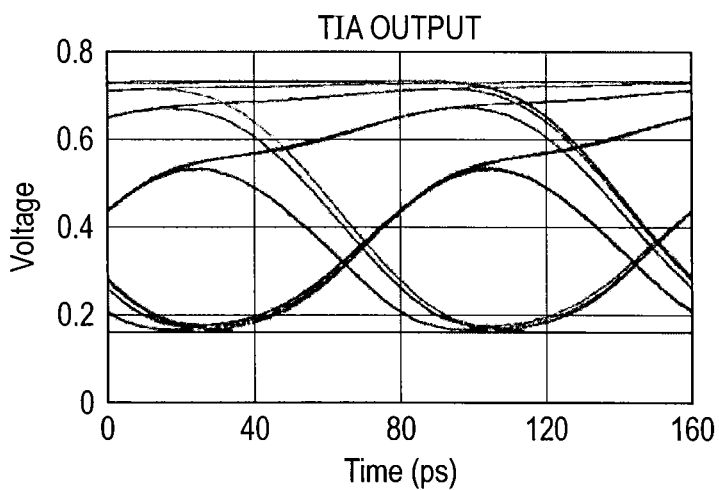
FIG. 3A is a graph showing output signals in an example.
Figure 3B:
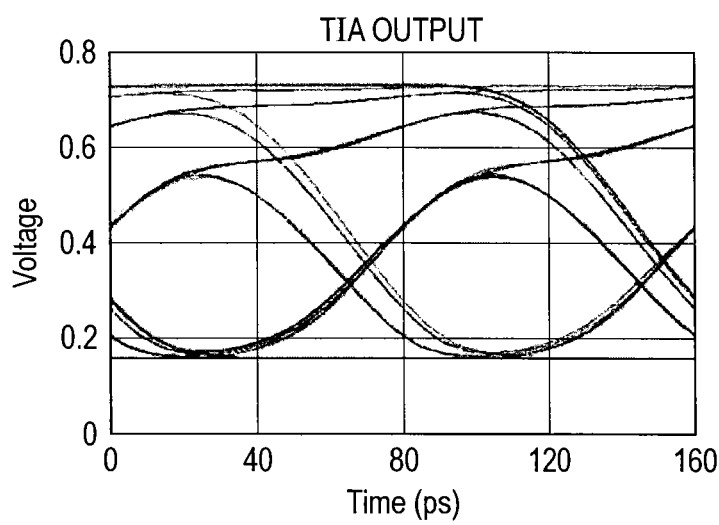
FIG. 3B is a graph showing output signals in another example.
Figure 3C:
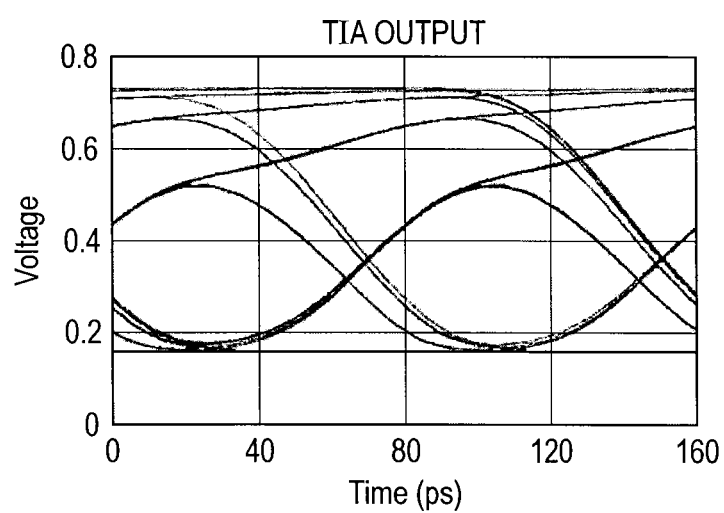
FIG. 3C is a graph showing output signals in the comparative example.

FIGS. 3A to 3C are graphs showing the voltages measured on the aggressor channels. FIG. 3A shows a result of Example 1, FIG. 3B shows a result of Example 2, and FIG. 3C shows a result of Comparative Example. In each of FIGS. 3A to 3C, the horizontal axis indicates time and the vertical axis indicates the voltage.

From FIGS. 3A to 3C, it is clear that the voltages on the aggressor channels varied little among Examples and Comparative Example. In any of the aggressor channels of Examples and Comparative Examples, a peak-to-peak voltage Vpp was around 0.58 V. It was thus confirmed that the adoption of the cross wiring did not cause any deterioration of output signals as compared to the straight wiring, and that the cross wiring was able to achieve signal transmission equivalent to that of the straight wiring.

Figure 4A:
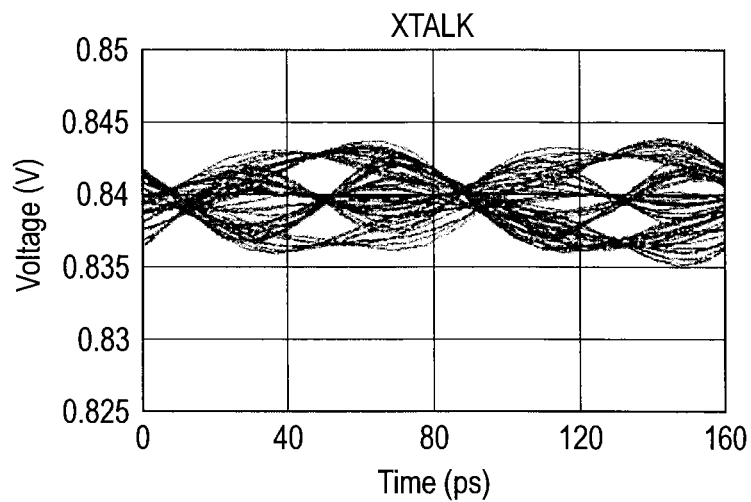
FIG. 4A is a graph showing crosstalk in the example.
Figure 4B:
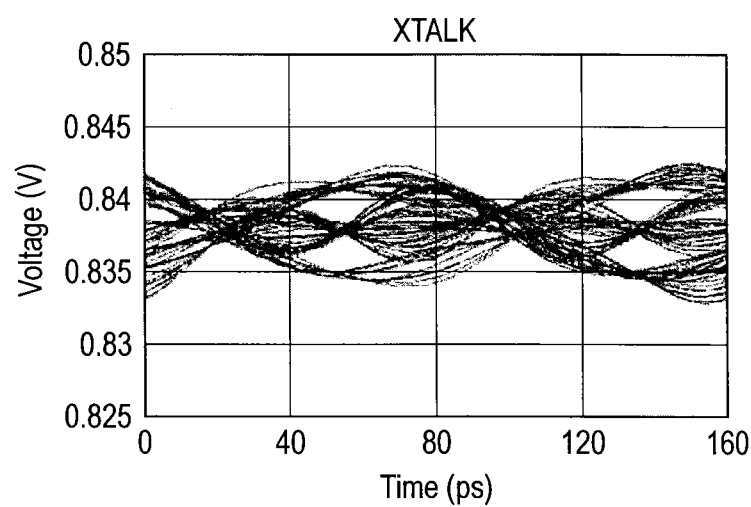
FIG. 4B is a graph showing crosstalk in the other example.
Figure 4C:
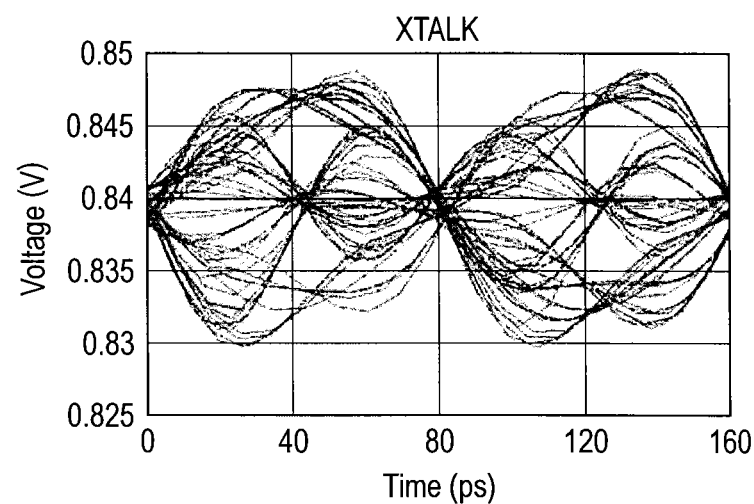
FIG. 4C is a graph showing crosstalk in the comparative example.

FIGS. 4A to 4C are graphs showing the voltages measured on the monitor channels. FIG. 4A shows a result of Example 1, FIG. 4B shows a result of Example 2, and FIG. 4C shows a result of Comparative Example. In each of FIGS. 4A to 4C, the horizontal axis indicates the time and the vertical axis indicates the voltage.

Since no voltage was applied to any of the monitor channels, the voltage measured on each monitor channel showed an amount of crosstalk from the aggressor channels. From FIGS. 4A to 4C, it is clear that the amount of crosstalk in each Example was smaller than the amount of crosstalk in Comparative Example.

Specifically, while the value Vpp in Comparative Example was about 0.019 V (−29.6 dB), the value Vpp in Example 1 was reduced to about 0.0080 V (−37.1 dB) and the value Vpp in Example 2 was reduced to about 0.0097 V (−35.5 dB). Meanwhile, the value Vpp in Example 3, which is not illustrated, was reduced to about 0.010 V (−35.2 dB). Accordingly, it was confirmed that the crosstalk was able to be significantly reduced, as compared to the straight wiring, by applying the cross wiring to micro circuits like those used in the simulation.

Second Embodiment

Figure 5:
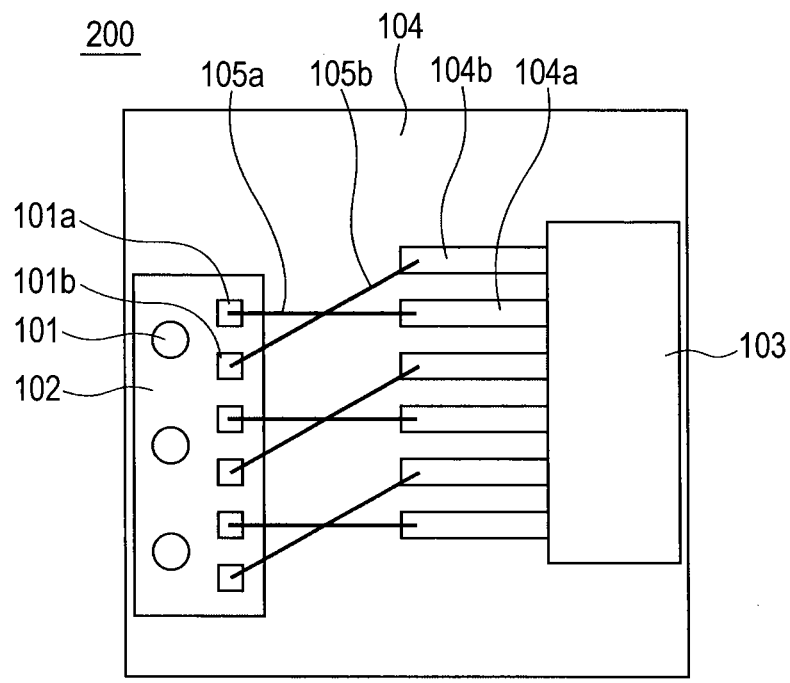
FIG. 5 is a schematic diagram of an optical module according to a second embodiment.

FIG. 5 is a schematic diagram of an optical module 200 of this embodiment. In the optical module 100 of the first embodiment, the height of the first wire 105a is different from the height of the second wire 105b, and the length (the total length) of the first wire 105a is therefore different from the length (the total length) of the second wire 105b. On the other hand, the optical module 200 of this embodiment is configured to establish equal length wiring in which the length of the first wire 105a becomes equal to the length of the second wire 105b. The establishment of the equal length wiring makes it possible to further enhance the crosstalk reduction effect and to achieve an additional effect that no signal delays occur between the wires.

The optical module 200 has the same constituents as does the optical module 100 of the first embodiment, but only the layout of the constituents is different.

In the optical module 200, the first wire 105a connecting the anode terminal 101a to the anode line 104a is disposed in a crossing manner above and away from the second wire 105b connecting the cathode terminal 101b to the cathode line 104b. At this time, the difference in height between the first wire 105a and the second wire 105b is compensated for by disposing the wires in such a way that a distance between the anode terminal 101a and the anode line 104a to be connected to the first wire 105a located above (i.e., a distance between the one end and the other end of the first wire 105a) becomes smaller than a distance between the cathode terminal 101b and the cathode line 104b to be connected to the second wire 105b located below (i.e., a distance between the one end and the other end of the second wire 105b). In the optical module 200, the relative positions of the terminals 101a, 101b between the lines 104a, 104b are displaced in the direction of the surface of the substrate 104 such that the lengths of the first wire 105a and the second wire 105b become equal.

On the other hand, when the first wire 105a passes under the second wire 105b, the wires may be disposed in such a way that the distance between the anode terminal 101a and the anode line 104a to be connected to the first wire 105a located below becomes larger than the distance between the cathode terminal 101b and the cathode line 104b to be connected to the second wire 105b located above.

Third Embodiment

Figure 6:
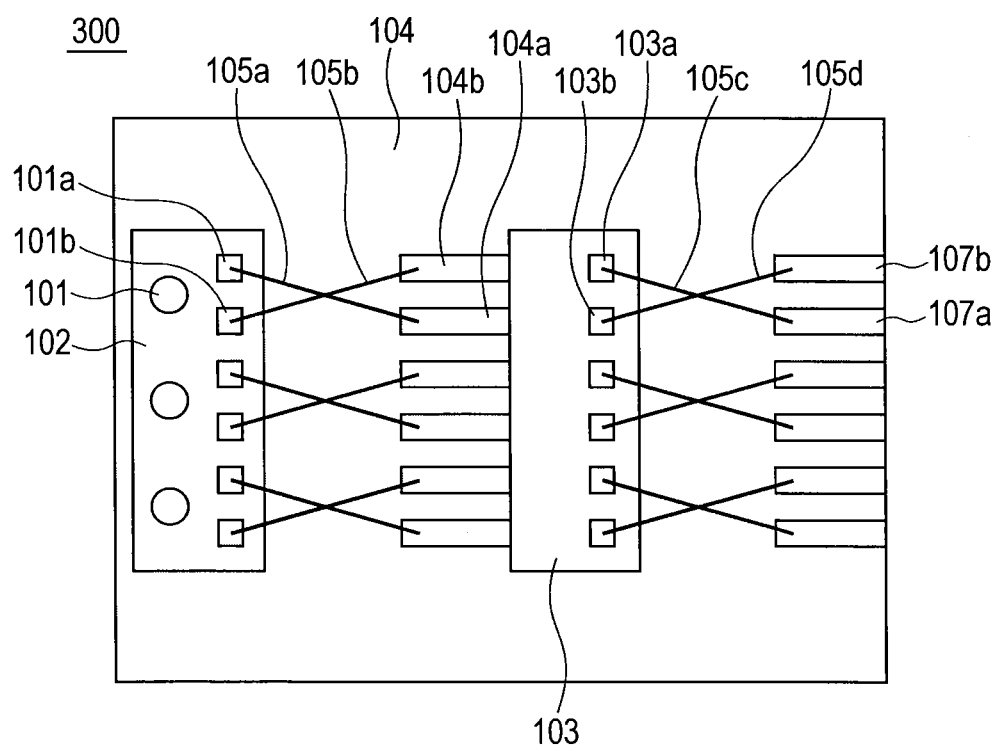
FIG. 6 is a schematic diagram of an optical module according to a third embodiment.
Figure 7:
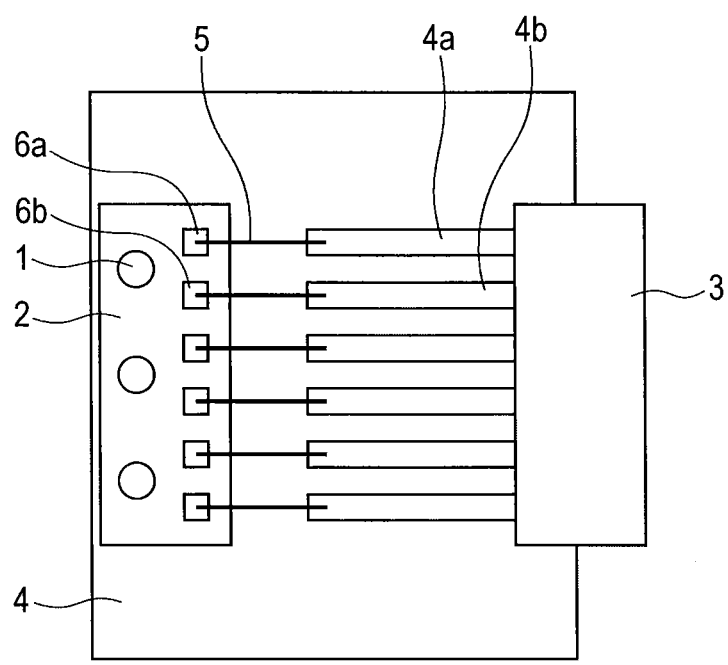
FIG. 7 is a schematic diagram of a conventional optical module.

FIG. 6 is a schematic diagram of an optical module 300 of this embodiment. The optical module 300 is characterized in that the optical module of the first embodiment further applies cross wiring to input-output wiring on the opposite side from the optical device 102 with respect to the control device 103. This configuration can further enhance the crosstalk reduction effect. Only portions that are different from those of the first embodiment, i.e., the portions on the opposite side from the optical device 102 with respect to the control device 103 will be described herein.

The control device 103 of the optical module 300 further includes input terminals 103a and output terminals 103b. At least as many input terminals 103a and output terminals 103b as the optical elements 101 are provided. Each pair of the input terminal 103a and the output terminal 103b adjacent to each other perform the input and output of signals to and from one optical element 101 (i.e., one channel).

The substrate 104 of the optical module 300 includes multiple conductive lines 107a and 107b located on the opposite side from the optical device 102 across the control device 103. Each line 107a to be connected to its corresponding input terminal 103a will be referred to as an input line 107a while each line 107b to be connected to its corresponding output terminal 103b will be referred to as an output line 107b. The input lines 107a and the output lines 107b are alternately provided in such a way as to be adjacent to one another. At least as many input lines 107a and output lines 107b as the optical elements 101 are provided.

In this embodiment, the lines 104a, 104b and the lines 107a, 107b are provided on the same substrate. However, the lines 107a and 107b may be provided on a substrate different from the one provided with the lines 104a and 104b.

The input terminals 103a are connected to different input lines 107a by third wires 105c, respectively. The input terminals 103a, the third wires 105c, and the input lines 107a thus connected collectively function as signal paths to transmit signals to the input terminals 103a, respectively. In the meantime, the output terminals 103b are connected to different output lines 107b by fourth wires 105d, respectively. The output terminals 103b, the fourth wires 105d, and the output lines 107b thus connected collectively function as signal paths to transmit signals from the output terminals 103b, respectively.

An input terminal 103a and an output terminal 103b related to each of the same channels are respectively connected to two lines 107a and 107b that are adjacent to each other.

In the state where the terminals are connected to the lines, each third wire 105c and its adjacent fourth wire 105d cross each other and are disposed out of contact with each other. A three-dimensional layout of the third wires 105c and the fourth wires 105d is similar to the three-dimensional layout of the first wires 105a and the second wires 105b shown in FIG. 2A. The third wire 105c connecting the input terminal 103a to the input line 107a is disposed in a crossing manner above and away from the fourth wire 105d connecting the output terminal 103b to the output line 107b. This configuration establishes a crossing state of the wires connecting the respective terminals 103a and 103b to the corresponding lines 107a and 107b, i.e., the wirings for the respective channels.

In this embodiment, the third wire 105c passes over the fourth wire 105d. Instead, the third wire 105c may pass under the fourth wire 105d as long as the third wire 105c and the fourth wire 105d cross each other without coming into contact with each other.

The wires in each of the same channels come close to each other by applying the cross wiring to the wiring between the control device 103 and the input lines 107a as well as between the control device 103 and the output lines 107b, whereby electromagnetic field coupling in each of the same channels is enhanced. In the meantime, coupling between different channels adjacent to each other is suppressed. As a result, crosstalk between the different channels is thought to be significantly reduced.

In this embodiment, the optical device is connected to the control device by the cross wiring, and the input-output wiring of the control device on the opposite side from the optical device employs the cross wiring at the same time. It is to be noted, however, that the crosstalk reduction effect is obtainable by applying the cross wiring to any portion of the wiring in one channel. Accordingly, the crosstalk can be reduced by connecting the optical device to the control device by the straight wiring, and applying the cross wiring only to the input-output wiring of the control device on the opposite side from the optical device.

Fourth Embodiment

Figure 8:
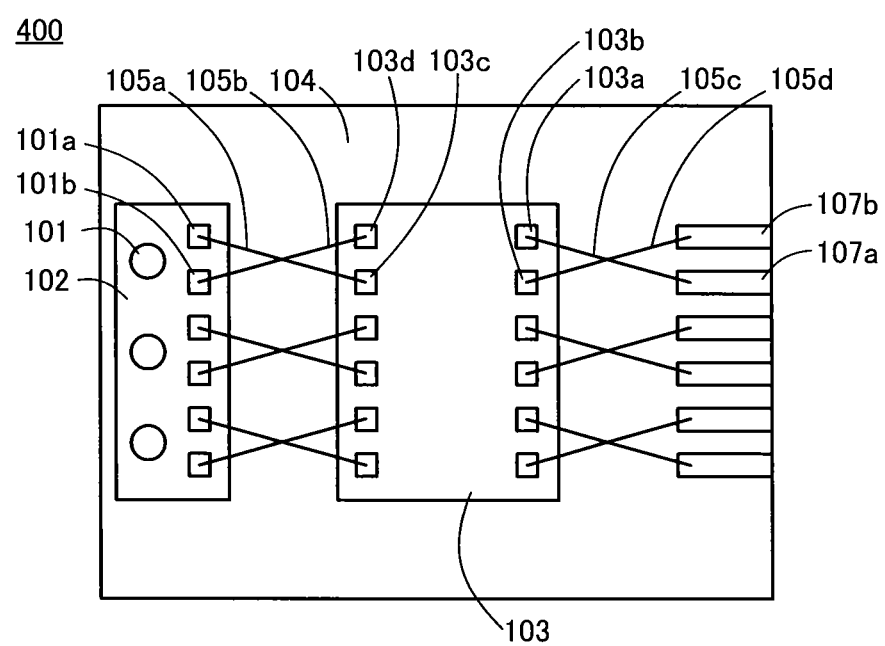
FIG. 8 is a schematic diagram of an optical module according to a fourth embodiment.

FIG. 8 is a schematic diagram of an optical module 400 of this embodiment. The optical module 400 is characterized in that input terminals 103c and output terminals 103d are provided on the optical device 102 side of the control device 103, instead of the lines 104a and 104b, in the optical module of the third embodiment. Only portions that are different from those of the third embodiment, i.e., the portions on the optical device 102 side with respect to the control device 103 will be described herein.

The control device 103 of the optical module 400 further includes input terminals 103c and output terminals 103d. At least as many input terminals 103c and output terminals 103d as the optical elements 101 are provided. Each pair of the input terminal 103c and the output terminal 103d adjacent to each other perform the input and output of signals to and from one optical element 101 (i.e., one channel).

The anode terminals 101a of the multiple optical elements 101 are connected to different input terminals 103c by first wires 105a, respectively. The anode terminals 101a, the first wires 105a, and the input terminals 103c thus connected collectively function as signal paths to transmit signals to the anode terminals 101a, respectively. In the meantime, the cathode terminals 101b of the multiple optical elements 101 are connected to different output terminals 103d by second wires 105b, respectively. The cathode terminals 101b, the second wires 105b, and the output terminals 103d thus connected collectively function as signal paths to transmit signals from the cathode terminals 101b, respectively.

An anode terminal 101a and a cathode terminal 101b of one optical element 101, or in other words related to the same channel, are respectively connected to two terminals 103c and 103d that are adjacent to each other.

In this embodiment, the lines 104a and 104b of the third embodiment are not provided, and the first wires 105a and the second wires 105b are directly connected to the input terminals 103c and the output terminals 103d of the control device 103, respectively. Accordingly, the lengths of signal paths can be configured short so that qualities of signals themselves are improved, while the effect of reducing crosstalk is obtained even more.

Please note that the configuration of this embodiment can be applied to the first or second embodiments. This is achieved by providing the input terminals 103c and the output terminals 103d on the optical device 102 side of the control device 103, instead of the lines 104a and 104b.

The present invention is not limited only to the above-described embodiments, and various changes are possible within the scope not departing from the gist of the present invention.

The wiring connecting the terminals to the lines may use any conductive lines other than the wires as long as such conductive lines fulfill a connection method that can establish the cross wiring. The cross wiring may be established by: forming bumps on the terminals and lines; and joining the bumps by using conductive bodies. Meanwhile, the cross wiring may be established by: forming the wire passing on a lower side of the crossing portion as a wiring pattern on a printed board; and forming the wire passing on an upper side of the crossing portion as a wire or a bump.

The cross wiring may be formed from wires directly connecting the terminals of the light receiving element and the terminals of the control device without the assistance of any lines on the substrate.

When the optical module is caused to function as a light emission module, a light emitting element such as an edge emitting laser and a vertical cavity surface emitting laser (VCSEL) may be used in place of the light receiving element. In this case, the control device applies a voltage for causing light emission to the light emitting element through the wires and the terminals.

The essence of the present invention is to apply the cross wiring to the wiring used in the optical module. Accordingly, the optical module of the present invention can use any optical element which is configured to perform at least any of light emission or light reception by transmission and reception of signals through an anode terminal and a cathode terminal.

What is claimed is:

1. An optical module comprising:
   an optical element including an anode terminal and a cathode terminal;
   a control device configured to transmit and receive signals to and from the optical element;
   a first signal path electrically connecting the anode terminal to the control device, at least part of the first signal path being formed from a first conductive line; and
   a second signal path electrically connecting the cathode terminal to the control device, at least part of the second signal path being formed from a second conductive line, wherein
   the first conductive line and the second conductive line cross each other and are out of contact with each other, and
   a difference in height between the first conductive line and the second conductive line is not more than 1.5 times an interval between the anode terminal and the cathode terminal to improve electromagnetic coupling in the first and second signal paths.

2. An optical module comprising:
   an optical element including an anode terminal and a cathode terminal;
   a control device configured to transmit and receive signals to and from the optical element;
   a first signal path electrically connecting the anode terminal to the control device, at least part of the first signal path being formed from a first conductive line; and
   a second signal path electrically connecting the cathode terminal to the control device, at least part of the second signal path being formed from a second conductive line,
   wherein the first conductive line and the second conductive line cross each other and are out of contact with each other, and
   a length of the first conductive line is configured to be equal to a length of the second conductive line by setting a distance between one end and an other end of one of the first conductive line and the second conductive line having a larger height smaller than a distance between one end and an other end of one of the first conductive line and the second conductive line having a smaller height to improve electromagnetic coupling in the first and second signal paths.

3. An optical module comprising:
   an optical element;

a control device including
  terminals electrically connected to the optical element,
    an input terminal configured to receive an input signal, and
    an output terminal configured to transmit an output signal;
a third signal path through which the input signal travels to the input terminal, at least part of the third signal path being formed from a third conductive line; and
a fourth signal path through which the output signal travels from the output terminal, at least part of the fourth signal path being formed from a fourth conductive line, wherein
the third conductive line and the fourth conductive line cross each other and are out of contact with each other, and
a difference in height between the third conductive line and the fourth conductive line is not more than 1.5 times an interval between the input terminal and the output terminal to improve electromagnetic coupling in the third and fourth signal paths.

4. An optical module comprising:
an optical element;
a control device including
  terminals electrically connected to the optical element,
  an input terminal configured to receive an input signal, and
  an output terminal configured to transmit an output signal;
a third signal path through which the input signal travels to the input terminal, at least part of the third signal path being formed from a third conductive line; and
a fourth signal path through which the output signal travels from the output terminal, at least part of the fourth signal path being formed from a fourth conductive line,
wherein a length of the third conductive line is configured to be equal to a length of the fourth conductive line by setting a distance between one end and an other end of the one of the third conductive line and the fourth conductive line having a larger height smaller than a distance between one end and an other end of one of the third conductive line and the fourth conductive line having a smaller height to improve electromagnetic coupling in the third and fourth signal paths.

5. The optical module according to claim 2, wherein the length of the first conductive line is configured to be equal to the length of the second conductive line, and the distance between the one end and the other end of one of the first conductive line and the second conductive line having the larger height is configured to be smaller than the distance between the one end and the other end of one of the first conductive line and the second conductive line having the smaller height, by relatively displacing positions of the anode and cathode terminals on the optical element against positions of the anode and cathode lines on the control device.

6. The optical module according to claim 4, wherein the length of the third conductive line is configured to be equal to the length of the fourth conductive line, and the distance between the one end and the other end of one of the third conductive line and the fourth conductive line having the larger height is configured to be smaller than the distance between the one end and the other end of one of the third conductive line and the fourth conductive line having the smaller height, by relatively displacing positions of the input and output terminals on the control device against positions of the input and output.

7. The optical module according to claim 1, wherein
the anode terminal and cathode terminal are alternately disposed on a surface of the optical element,
the control device includes an anode line and cathode line that are alternatively disposed as terminals of the control device in an order different than the anode terminal and cathode terminal,
the first signal path electrically connects the anode terminal directly to the anode line of the control device, and
the second signal path electrically connects the cathode terminal directly to the cathode line of the control device.

8. The optical module according to claim 1, wherein each of the first conductive line and the second conductive line is a wire.

9. The optical module according to claim 1, further comprising:
a plurality of the optical elements,
wherein the first signal path and second signal path form a first channel of a plurality of channels formed between each optical element and the control device, and each channel having conductive lines that do not cross each other to reduce coupling and crosstalk between different channels.

* * * * *